United States Patent [19]

Primdahl Iversen et al.

[11] Patent Number: 5,319,843
[45] Date of Patent: Jun. 14, 1994

[54] METHOD OF MANUFACTURING A SUPERCONDUCTIVE CABLE

[75] Inventors: Ivar Primdahl Iversen, Lyngby; Hans J. Henriksen, Helsinge, both of Denmark

[73] Assignee: Haldor Topsoe A/S, Denmark

[21] Appl. No.: 601,682

[22] PCT Filed: Apr. 24, 1989

[86] PCT No.: PCT/DK89/00094
§ 371 Date: Oct. 23, 1990
§ 102(e) Date: Oct. 23, 1990

[87] PCT Pub. No.: WO89/10633
PCT Pub. Date: Nov. 2, 1989

[30] Foreign Application Priority Data

Apr. 25, 1988 [DK] Denmark .................... 2240/88

[51] Int. Cl.$^5$ ............................................. H01L 39/24
[52] U.S. Cl. ................................. 29/599; 505/433; 505/704; 505/740
[58] Field of Search .................. 29/599; 174/125.1; 505/1, 704, 739, 740

[56] References Cited

U.S. PATENT DOCUMENTS

| | | | |
|---|---|---|---|
| 4,966,886 | 10/1990 | Hoshiko | 29/599 X |
| 5,004,722 | 4/1991 | Tallman | 505/1 |
| 5,043,320 | 8/1991 | Meyer et al. | 29/599 X |
| 5,045,527 | 9/1991 | Ikeno et al. | 505/1 |
| 5,081,075 | 1/1992 | Jin et al. | 29/599 X |
| 5,098,178 | 3/1992 | Ortabasi | 505/1 |
| 5,100,867 | 3/1992 | Gunzelmann | 505/1 |
| 5,102,865 | 4/1992 | Woolf et al. | 505/1 |
| 5,106,825 | 4/1992 | Mandigo et al. | 505/1 |
| 5,122,507 | 6/1992 | Yamamoto et al. | 505/1 |
| 5,168,127 | 12/1992 | Kohno et al. | 505/1 X |

*Primary Examiner*—Timothy V. Eley
*Attorney, Agent, or Firm*—Ostrolenk, Faber, Gerb & Soffen

[57] ABSTRACT

A superconductive conductor or cable comprising a core, which comprises at least one string of a ceramic, superconductive material, and where the core is encapsulated by a metal cap. In order to manufacture a conductor or a cable with an encapsulation, and in which it is possible as well during the manufacturing process as under the operation to maintain a controlled atmosphere around the superconductive core, at least one layer of not sintered, ceramic powderous material is provided between the cap and the core, which material has a higher sintering temperature than the superconductive material in the core. The superconductive core may be sintered for formation of the superconductive ceramics by placing in the tubular metal cap a starting material in powderous form, and shaped as a core in the other ceramic powder material and subsequently forgeing the the metal cap with its content, preferably by swaging at an ambient temperature, which is below the sintering temperature of the core.

11 Claims, 1 Drawing Sheet

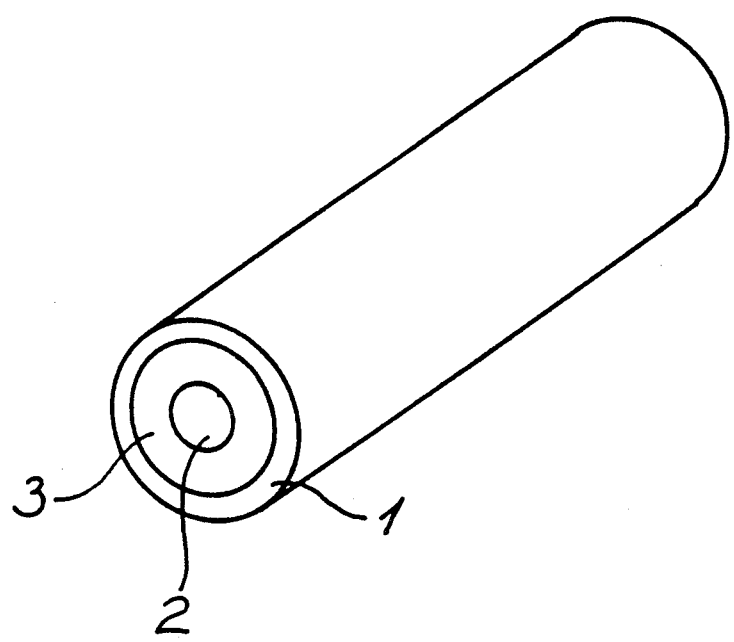

METHOD OF MANUFACTURING A SUPERCONDUCTIVE CABLE

BACKGROUND OF THE INVENTION

The present invention relates to a superconductive conductor or cable comprising a core, which comprises at least one string of a ceramic superconductive material, and where the core is encapsulated by a metallic cap. Furthermore the invention relates to a method of manufacturing such a conductor or cable.

Ceramic compounds of the type, which are often designated by, the formula Y-Ba-Cu-O have metals in oxidized form and exhibit electric superconductive characteristics at a substantially higher temperature than that of conventional superconducting materials. Because of the relatively high marginal temperature of the superconductive characteristics, this type of compounds has become more interesting for use in a greater variety of industrial application. The ceramic compounds form a whole group of materials, in which copper and oxygen seem to be the only required materials, as they, in addition to or instead of the metals yttrium and barium, may also comprise e.g. scandium, various lanthanides, calcium or strontium. Superconductors comprising other materials, e.g. bismuth and/or thallium are also known, as such materials may completely or partly replace the abovementioned metals. Furthermore, it is known that the superconductive characteristics may be improved in some cases, if fluorine replaces part of the oxygen.

The use of the superconductive materials is restricted by the fact that the manufacture of these conductors in sufficient lengths and with a sufficiently homogeneous structure for the industrial application of fabricating cables is difficult and costly. An essential problem in this connection is that in the manufacturing process a solid-reaction between suitable compounds, e.g. oxides, carbonates or oxalates must take place; that the reaction must take place under a controlled set of temperature, and that the composition of the surrounding atmosphere may be of considerable importance. In particular, a high partial pressure of oxygen may be necessary. Furthermore there is a considerable risk that the reaction product thus formed may be unstable and liable to split off e.g. oxygen. It may, therefore, be necessary to surround the superconductive core, also under later operation, by a controlled atmosphere.

These problems are discussed in Fujikura Technical Review, No. 17, Feb. (Tokyo JP), H. Osani et al, pages 1–4, in which different materials for the metal cap have been tested, and in Advanced Ceramic Materials—Ceramic Superconductors, Volume 2, No. 38, Special Issue, Jul. 1988, (Westerville, Oh., US), R. W. McCallum et al pages 388–400, in which silver is identified as a preferred material for encapsulation because of its permeability to $O_2$, and in which addition of silver oxides inside the cap has been suggested as a means for controlling the atmosphere inside the cap during the sintering process of the superconductive material.

SUMMARY OF THE INVENTION

The object of the present invention is to provide a conductor or a cable with an encapsulation, and in which it is possible both during the manufacturing process and during the later application to maintain a controlled atmosphere around the superconductive core.

This object is achieved by means of a conductor or a cable of the abovementioned kind, the cable being characterized by the presence of a ceramic powderous material between the cap and the ceramic core of the cable.

Due to the fact that the ceramic, superconductive core is surrounded by an only partially sintered ceramic powderous material, a flow of gas and diffusion in the pore volume, which exists in such material, can take place. On account of the higher sintering temperature of the surrounding material, it will remain porous also during various manufacturing processes, to which the cable will be subjected in the production process, and it is therefore ensured that the surrounding material will retain its permeability to gas.

According to the invention it is preferable that the surrounding layer has a high temperature stability, and preferred embodiments of the invention hot and cold resistant oxides can be mentioned, especially oxide ceramics preferably MgO, $Al_2O_3$ or $ZrO_2$.

In order to be able to maintain a controlled atmosphere around the conductive core, it is preferable according to the invention that the cable comprises elements for introducing a maintaining or regenerating gas, e.g. $O_2$ in the non-sintered material.

The invention further relates to a method of manufacturing an electric superconductive conductor or cable, in which method one or more materials, which under specified circumstances can be made superconductive, are placed in the form of at least one continuous string in a metallic, tubular, closed cap, which thereafter is subjected to a forging process producing a deformation of the closed cap. The deformation can be caused by swaging, hammering or causing an explosion in the cap producing a tightly confined materials reduction of the cross section surrounding the.

From Japanese Patent No. 6113663-A, dated Jun. 24, 1986, it is known in a continuous process to convey a superconductive bundle of thread, comprising an armoring thread, which is to be formed into cylindrical shape together with a metal band, which will be rolled around the bundle of thread in such a way that cavities are eliminated. Subsequent to seam welding of the metal band for the purpose of forming a tube, the cross section of the tube is reduced by at least 80% by swaging and finally it is rolled into square cross section. The superconductive threads are manufactured by use of heat treatment of a suitable compound. The metal band is made of Cu or Al and the reinforcing threads are stainless steel, Mo or W.

The present invention also is directed to a method of manufacturing a superconductive cable involving the steps of placing a continuous string of superconductive ceramic material inside a tubular, closed metal cap. Thereafter, the closed metal cap is subjected to a forging process by means of swaging, hammering or an explosive process, all of which result in the reduction of the cross-section of the cap to thereby tightly surround and compress the enclosed materials. The superconductive ceramic material being of such a type that it achieves superconductive properties under specified heating conditions when it is surrounded by a powderous ceramic material the sintering temperature which is higher than the reaction temperature of the composition of the core itself which is comprised of superconductive ceramic material.

Due to the fact that the sintering temperature of the surrounding material is higher than the reaction temperature of the solid substance of the superconductive material it is ensured that around the superconductive core there will be a permeable layer, through which it is possible to introduce the maintaining atmosphere around the core.

Preferably, the composition forming the superconductive ceramic material core is introduced into the cap as a powder. During the forging process, the cross-section of the cap will be reduced and the powderous composition is sintered under pressure to form the superconductive ceramic material core.

Surprisingly it has proved that the necessary solid substance reaction, which normally takes a protracted heating under high pressure and with a controlled composition of the surrounding atmosphere, may be attained through a forging of the cap, when the forging takes place with such an intensity that the powder is compressed simultaneously with the reduction of the diameter of the tube. In practice the forging may preferably be carried out through swaging, i.e. in a reduction machine, and it has proved that the desired reaction sets in quickly and that a sintering of the superconductor takes place in such a way that the desired characteristics are achieved even though several meters of tubular cap are advanced through the machine per minute of time.

According to the invention it is preferable that the tube is made from a hard and ductile metal, e.g. a corrosion resistant steel, which provides a relatively high resistance to the forging. It is particularly important that the tube material does not show any tendency to absorb oxygen, which may be liberated from the superconductive ceramic material.

Thus a method is provided, in which the previously so problem-filled sintering process may be carried out in a fast and efficient way, the hitherto existing limitations on the length of the sintered strings being eliminated.

In this connection it should be mentioned that from U.S. Pat. No. 4,717,627 it is known to manufacture a fine-grained, superconductive or magnetic material by means of the following procedure: On a first layer of solid material a second layer of powder and a third layer of solid material are placed, and the assembly is placed in a sturdy container. Then a supersonic wave is transmitted through the first, the second, and the third layer in the sequence mentioned, so that the second layer is heated to a temperature exceeding the melting point of the material by means of a shockwave pressure which is higher than 50 kBar. The melted, compressed layer will rapidly cool by heat transmission to the other two layers.

BRIEF DESCRIPTION OF THE DRAWING

The invention will be described in detail by means of an embodiment and with reference to the drawing, which shows a section of a superconductive cable according to the invention.

DETAILED DESCRIPTION

As shown in the drawing, the superconductive conductor or cable according to the invention comprises an outer metallic cap 1, in which a core 2 of a superconductive ceramic material is placed. In the space between the core 2 and the cap 1, a diffusive ceramic material 3 is placed, which has a higher sintering temperature than the superconductive core 2. The diffusive material makes it possible before, under and/or after the sintering of the superconductive material, to optimize the surrounding atmosphere around the core, providing it with properties which act to preserve or regenerate the core. In most cases the problem is to control the contents of $O_2$, the superconductive core preferably consisting of a ceramic material in Y-Ba-Cu-O category, but which comprises a great number of superconductive ceramic materials, which become superconductive at temperatures about and somewhat over the boiling point of liquid N. These materials may contain elements other than the above mentioned: Yttrium, barium, copper and oxygen.

The cable may be provided with means for maintaining a predetermined atmosphere in the material 3, e.g. in the form of welded stubs. The material 3 is a ceramic powder, which has a higher sintering temperature than the superconductive core 2. Preferably a temperature-resistant oxide of one of the ceramic oxides will be used, e.g. $MgO$, $Al_2O_3$ or $ZrO_2$.

In manufacturing the cable care must be taken that the cap closely surrounds the core and the powder-like layer. This may be achieved following the method according to the invention. In a special aspect of the method the necessary solid matter reaction, which transforms a superconductive powder into a sintered superconductive ceramic string of material is achieved.

In addition, the core of the cable may comprise elements for mechanical reinforcement of the core, for cooling thereof or for dividing it into a number of parallel conductors.

A superconductive cable according to the invention and of a limited length can be manufactured in the following way: A tube of Inconel, which is a temperature-resistant and corrosion-resistant compound with a high content of Ni and corrosion-resistant compound with a high content of Ni and having an outer diameter of 14 mm and an inner diameter of 11 mm is filled with an intermediate layer of an isolating, ceramic powder $Al_2O_3$ adjacent to the metal wall and a core of a powder which constitutes the superconductive core in the following way: Within the Inconel tube a tube, made for example of glass is placed, said tube having an outer and an inner diameter of 8 mm and 6 mm respectively, and within this tube is placed a tube with an outer and an inner diameter of 4 mm and 3 mm respectively. In the inner tube is placed a metal bar of a thickness of 2 mm. By means of funnels two different kinds of powders are dosed. By means of the first funnel $Al_2O_3$ is added to the interspace between the Inconel tube and the glass tube, and by help of the second the powder having the composition $YBa_2Cu_3O_x$ and a powder grain dimension of 0–60 is fed, said powder forming the superconductive string, in the space between the inner tube and the metal bar. Firstly, approximately 5 cm $Al_2O_3$ powder is filled into the outer opening while the outer glass tube is being used for stamping. Then the inner tube is drawn up 1-2 cm, and superconductive powder is added which powder then is stamped with the metal bar. Subsequently, the glass tube is again lifted and there is filled up and stamped until a height of 4–4.5 cm is achieved Again $Al_2O_3$ powder is added, said powder being stamped etc., until the tube is filled with powder. The tube is then sealed with on-welded terminals and subsequently forged to the specified diameter. In this case the tube was processed in a swaging machine thereby achieving a reduction in diameter from 14 mm to 9 mm. At the same time a corresponding pressing of the ceramic powder was achieved. The reduction of the diameter in the swaging machine took place with an advancing speed of 1-2 m/minute.

The superconductive cable manufactured in this way was tested and the following measurements carried out on the superconductive string according to the formula $YBa_2Cu_3O_x$:

| | |
|---|---|
| Dimension of crystallite (measured by X-ray diffraction) | approx. 1300 Å |
| Dimension of crystallite (measured by X-ray diffraction) | approx. 1300 Å |
| Porosity (measured by Hg-porosimetry) | approx. 1.5 Vol % |
| Skeleton density (measured by Hg-porosimetry) | approx. 5.55 g/ml |
| Positive indication of Meisner-effect at 77K. | |

After the heating treatment of the cable in 2 h at 930° C. the superconductive string has been investigated for shrinkage, and it was found that the string lies solidly embedded in the surrounding materials. Before the heating treatment it was found that a regular sintering of the $Al_2O_3$ layer had not taken place, but it is found as a compact powder.

The powder, being used for making the superconductive string, had a normal composition for the forming of a superconductor of the type Y-Ba-Cu-0. However the same method will also be applicable in connection with other compositions of ceramic superconductors. Furthermore, it is possible to support the sintering of the superconductor in the forging process by means of heating to a temperature, which is below 900° C. said temperature being a common temperature for achieving sintering by heating alone. At such temperatures below 900° C. the surrounding ceramic insulation will maintain its permeability, whereby it will be possible also during the forging to regulate the atmosphere surrounding the core.

In addition to swaging, which is used in the example, the forging may take place by hammering or by an explosion-deformation. Furthermore, the forging may take place in such a way, that the tube achieves another form than the normally used circular form. Moreover, it is possible in the core to embed reinforcing- or cooling elements and elements which divide the core into a number of parallel strings.

The manufacture of larger lengths of superconductive cables may be performed by application of modifications of the technology which is known from manufacturing of continuously filled, tubular packings. When the various strings of powder have been placed in the tube forming the cap and stamped appropriately, the sintering of the core may be carried out by swaging in particular, which allows treatment of even very large lengths of material.

We claim:

1. Method of manufacturing an electric superconductive cable made of a composition of one or more superconductive ceramic material, which under specific conditions of manufacture is made superconductive and having a core located in a tubular, closed metal cap, comprising: introducing a powderous ceramic material between the core and the cap to surround the core and subjecting the cap to a forging process by means of swaging, hammering or explosion-deformation, to reduce the cross section of the cap to tightly surround the materials in the cap, the superconductive ceramic material being of such a type that it may achieve its superconductive properties in a solid material reaction under heating, the sintering temperature of the powderous ceramic material being higher than the sintering temperature of the composition forming the core.

2. Method according to claim 1, characterized in that the composition forming the core is introduced into the cap in the form of a powder, and forming the core by the forging process being carried out with such an intensity that the cross section of the cap is reduced and the core is pressed and sintered during its formation.

3. Method according to claim 2, characterized in that in order to increase the effect of the forging process, the cap is manufactured from a hard and ductile metal.

4. Method according to claim 3, characterized in that before, during and/or after the forging process a protecting or regenerating atmosphere, is introduced into the powderous ceramic material surrounding the core.

5. A method according to claim 4, characterized in that the atmosphere is oxygen.

6. Method according to claim 2, wherein the cap is heated to a temperature below the temperature at which sintering of the composition forming the core takes place.

7. Method according to claim 6, characterized in that before, during and/or after the forging process, a protecting or regenerating atmosphere, is introduced into the powderous ceramic material surrounding the core.

8. A method according to claim 7, characterized in that the atmosphere is oxygen.

9. Method according to claim 6 characterized in that before, during and/or after the forging process a protecting or regenerating atmosphere is introduced into the powderous ceramic material surrounding the core.

10. A method according to claim 9, characterized in that the atmosphere is oxygen.

11. A method according to claim 2, characterized in that in order to increase the effect of the forging process, the cap is of corrosion resistant steel.

* * * * *